(12) United States Patent
Yamashita

(10) Patent No.: US 6,741,090 B2
(45) Date of Patent: May 25, 2004

(54) HOLDING DEVICE FOR ELECTRONIC PART TEST, AND DEVICE AND METHOD FOR ELECTRONIC PART TEST

(75) Inventor: Tsuyoshi Yamashita, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/416,269

(22) PCT Filed: Nov. 9, 2001

(86) PCT No.: PCT/JP01/09839

§ 371 (c)(1),
(2), (4) Date: May 9, 2003

(87) PCT Pub. No.: WO02/39129

PCT Pub. Date: May 16, 2002

(65) Prior Publication Data

US 2004/0027147 A1 Feb. 12, 2004

(30) Foreign Application Priority Data

Nov. 10, 2000 (JP) ......................................... 2000-343408

(51) Int. Cl.[7] .............................................. G01R 31/02
(52) U.S. Cl. ...................................................... 324/755
(58) Field of Search ................................ 324/755, 760, 324/761, 754, 763, 158.1, 765; 219/209; 702/130, 132; 713/300, 320, 322, 340

(56) References Cited

U.S. PATENT DOCUMENTS 5,134,436 A * 7/1992 Fujioka ........................ 355/30
5,229,580 A * 7/1993 Chioniere .................. 219/521
5,708,222 A   1/1998 Yonezawa et al.

FOREIGN PATENT DOCUMENTS

| JP | 61-236134 A | 10/1986 |
|---|---|---|
| JP | 2000-162269 A | 6/2000 |

* cited by examiner

Primary Examiner—Evan Pert
Assistant Examiner—Trung Q Nguyen
(74) Attorney, Agent, or Firm—Birch, Stewart, Kolasch & Birch, LLP

(57) ABSTRACT

A test holding device having a holding head 102 for detaching holding and conveying an IC chip 110 for connecting the IC chip 110 to connection terminals 112 of a test socket 114. The holding head 102 is provided with a heater 111 able to heat the IC chip 110 in accordance with need. The holding head 102 is provided with a cooling nozzle 117 able to cool the IC chip 110 in accordance with need. A control device 130 control the amount and/or temperature of the air discharged from the heater 111 and cooling nozzle 117 so as to heat the IC chip 110 by the heater 111 and cool the IC chip 110 by the cooling nozzle while conveying the IC chip 110 by the holding head 102 and to heat the IC chip 110 by the heater 111 and stop or weaken the cooling by the cooling nozzle 117 while pressing the IC chip 110 to the connection terminals 112 by the holding head 102.

14 Claims, 5 Drawing Sheets

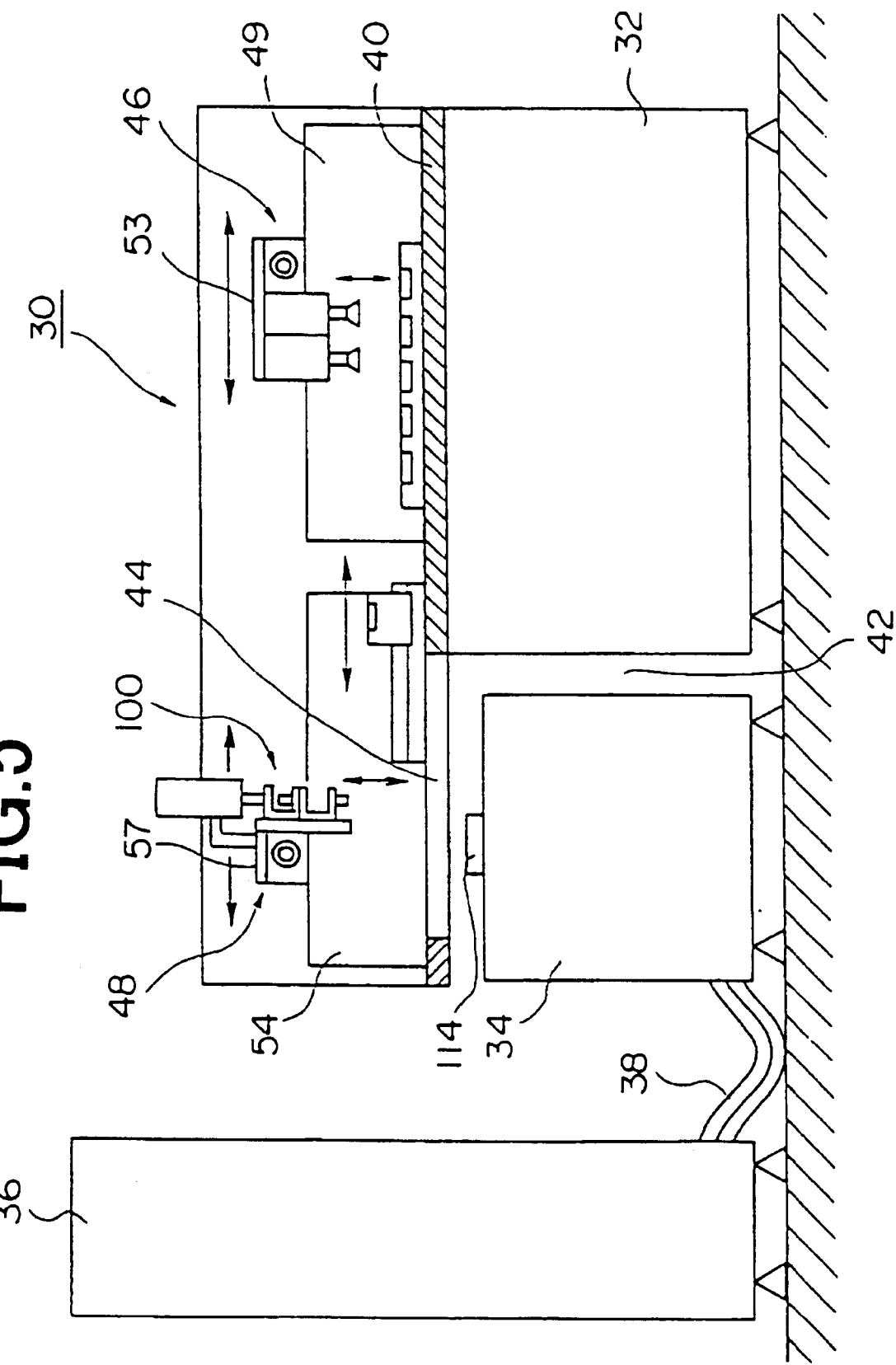

HOLDING DEVICE FOR ELECTRONIC PART TEST, AND DEVICE AND METHOD FOR ELECTRONIC PART TEST

This application is the national phase under 35 U.S.C. § 371 of PCT International Application No. PCT/JP01/09839 which has an International filing date of Nov. 9, 2001, which designated the United States of America.

TECHNICAL FIELD

The present invention relates to an electronic device test holding device, an electronic device test apparatus, and an electronic device test method suitable for high temperature testing of an IC chip or other electronic device.

BACKGROUND ART

In the process of manufacture of a semiconductor device, a test apparatus is required for testing the finally produced IC chip or other electronic device. Such a test apparatus conducts this test while pressing the terminals of the IC chip under test against connection terminals of a test socket.

An electronic device has to be guaranteed to operate even under harsh environments, so is sometimes tested under certain temperatures (for example, 125° C. or so) higher than an ordinary temperature. In the case of such a high temperature test, the electronic device is heated to that certain temperature before connecting the electronic device to the connection terminals of the test socket. Further, when conveying the electronic device to the test socket after heating, to prevent the electronic device from being cooled and the temperature from falling, the electronic device holding device for holding and conveying the electronic device is provided with a heater for preventing a drop in temperature of the electronic device.

An IC chip or other electronic device, however, is small in heat capacity, so when conveying the electronic device, pressing it against the connection terminals of the test socket, and starting the test, heat is robbed from the electronic device by the connection terminals and the temperature of the electronic device easily falls. That is, the temperature of the electronic device, which is held at a certain temperature at so much effort by the heater of the electronic device holding device, falls along with the start of the test and therefore the electronic device can no longer be tested at the predetermined set temperature. This causes a remarkable drop in the reliability of the test.

To prevent this inconvenience, it may also be considered to provide a heater at the test socket side to prevent a drop in temperature of the electronic device.

With this technique, however, since each time the electronic device to be tested changes, the test socket also changes, it is necessary to design the heater, which is to be attached for each test socket, for each individual socket. The design man-hours for this increases and the manufacturing cost of the test apparatus rises. Further, since a heater is required for each type of socket, the running cost of the test apparatus also increases.

DISCLOSURE OF THE INVENTION

The present invention has been made in consideration of this actual situation and has as its object the provision of an electronic device test holding device, electronic device test apparatus, and electronic device test method able to maintain an electronic device to be tested at a predetermined high temperature state and perform a high temperature test well without causing an increase in the manufacturing cost or running cost of the test apparatus.

To achieve the above object, an electronic device test holding device according to the present invention comprises:
a holding head for detachably holding and conveying an electronic device for connecting the electronic device with connection terminals for testing,
a heating means attached to said holding head and able to heat said electronic device in accordance with need,
a cooling means attached to said holding head and able to cool said electronic device in accordance with need, and
a controlling means for controlling said heating means and said cooling means so as to heat said electronic device by said heating means and to cool said electronic device by said cooling means while conveying said electronic device by said holding head and so as to heat said electronic device by said heating means and to stop or weaken the cooling by said cooling means when pressing said electronic device to said connection terminals by said holding head.

Further, an electronic device test apparatus according to the present invention comprises:
connection terminals for testing,
a holding head for detachably holding and conveying an electronic device for connecting the electronic device with connection terminals for testing,
a heating means attached to said holding head and able to heat said electronic device in accordance with need,
a cooling means attached to said holding head and able to cool said electronic device in accordance with need,
a movement mechanism for making said holding head move in a horizontal direction and/or a vertical direction, and
a controlling means for controlling said heating means and said cooling means so as to heat said electronic device by said heating means and to cool said electronic device by said cooling means while conveying said electronic device with said holding head drived by said movement mechanism and so as to heat said electronic device by said heating means and to stop or weaken the cooling by said cooling means when pressing said electronic device to said connection terminals by said holding head.

Preferably, said controlling means controls said cooling means so as to rob from said electronic device during the conveyance of said electronic device an amount of heat corresponding to the amount of heat which escapes from said electronic device to said connection terminals when said electronic device contacts said connection terminals.

Preferably, said cooling means is a cooling air discharge nozzle. Another cooling means is an electronic cooling means using a Peltier device etc. Further, it may also be cooling by contact with a metal having a large heat mass.

Preferably, said cooling air discharge nozzle is formed integrally with a discharge opening of a cooling air passage formed inside said holding head. The cooling air discharge nozzle however may also be the front end opening of a cooling tube attached to the holding head.

Preferably, said holding head is provided with a suction holding nozzle for detachably holding an electronic device by suction. In this case, preferably said cooling means is a cooling air discharge nozzle. Said cooling air discharge nozzle is formed around said suction holding nozzle.

An electronic device test method according to the present invention is characterized by:

heating an electronic device and cooling said electronic device while conveying said electronic device, heating said electronic device and stopping or weakening the cooling when pressing said electronic device against connection terminals for a test, and controlling the temperature of the electronic device during conveyance so as to become approximately equal to the temperature of the electronic device during the test.

Preferably, said cooling means is controled so as to rob from said electronic device during the conveyance of said electronic device an amount of heat corresponding to the amount of heat which escapes from said electronic device to said connection terminals when said electronic device contacts said connection terminals.

Preferably, said electronic device is cooled while testing said electronic device in the same way or slightly less cooling way as during conveyance of said electronic device after the temperature of said test connection terminals approaches the temperature of said electronic device.

The electronic device test apparatus and test method having the electronic device test holding device according to the present invention heat and cool the electronic device while conveying the electronic device and heat the electronic device and stop or weaken the cooling of the electronic device when pressing the electronic device against connection terminals for a test.

That is, they heat the electronic device to a temperature higher than the set temperature of the test and cool the electronic device to close to the set temperature of the test during conveyance of the electronic device. Further, they stop or weaken only the cooling of the electronic device while pressing the electronic device against the connection terminals for a test. The electronic device from the electronic device holding device continues to be heated. If pressing an electronic device against connection terminals, the heat of the electronic device is robbed by conductance from there and the temperature of the electronic device falls. When pressing an electronic device against connection terminals, however, the cooling of the electronic device is stopped or weakened almost simultaneously, so the escape of heat by conduction to the connection terminals is canceled by the stopping or weakening of the cooling of the electronic device and the temperature of the electronic device is maintained at the set temperature of the test.

Therefore, in the present invention, it becomes possible to maintain the temperature of the electronic device during the test at a predetermined set temperature without attaching a heater to the test socket side where the connection terminals are provided and possible to conduct a test accurately with a high reliability.

Note that if continuously testing electronic devices, the connection terminals of the test socket also gradually will rise in temperature and the movement of heat due to conductance from the electronic devices to the connection terminals becomes smaller. In such a case, it is sufficient not to completely stop the cooling by the cooling means of the electronic device holding device, but to continue cooling by a cooling efficiency smaller than during conveyance of the electronic devices.

BRIEF DESCRIPTION OF DRAWINGS

Below, the present invention will be explained based on embodiments shown in the drawings. There, FIG. 5 is a schematic side view of the test apparatus shown in FIG. 4.

BEST MODE FOR CARRYING OUT THE INVENTION

First Embodiment

Figure 1:
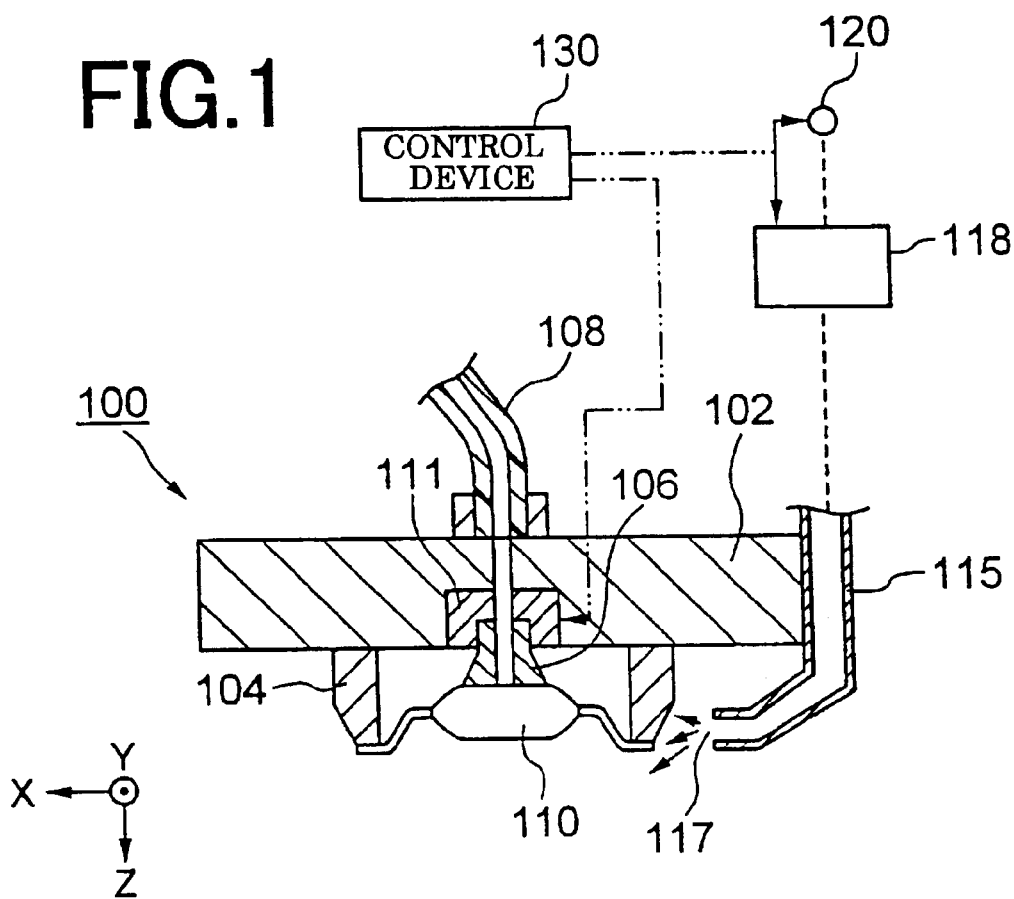
FIG. 1 is a schematic view of the configuration of an electronic device test holding device according to an embodiment of the present invention.
Figure 1:
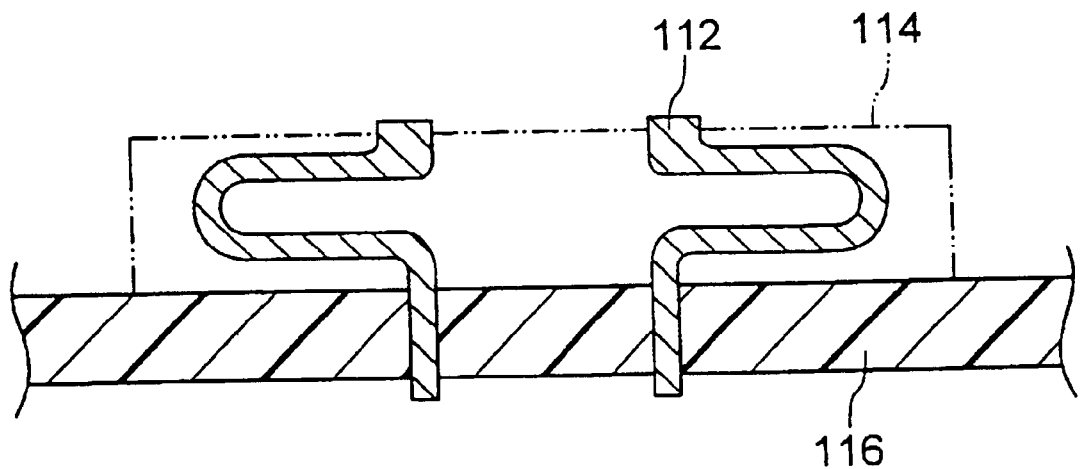

As shown in FIG. 1, the electronic device test holding device 100 according to a first embodiment of the present invention has a holding head 102 to which a suction holding nozzle 106 for detachably holding an IC chip 110 serving as an electronic device under test is attached. The holding head 102 can move in a Z-axial direction by a not shown Z-axis movement device and can move in X-axial and Y-axial directions by a not shown XY-axis movement device.

The suction holding nozzle 106 has a lead press 104 attached to and fixed around it. The front end of the lead press 104 can contact the terminals of the IC chip 110. Shapes of lead presses 104 are prepared in accordance with the shapes of the IC chips 110 under test. The lead press 104 is preferably able to be freely exchanged at the holding head 102.

To cause the suction holding nozzle 106 to generate a suction holding force, the holding head 102 has a suction tube 108 connected to it. The suction tube 108 is connected to for example a not shown ejector or other negative pressure generating means. Negative pressure is guided to the front end of the suction holding nozzle 106 connected to the suction tube 108 and detachably holds the IC chip 110 by suction. Note that in the present invention, the IC chip 110 may also be held by a mechanical means other than the suction holding nozzle 106.

The holding head 102 is provided with a heater 111 as the heating means and can heat the IC chip 110 through the nozzle 106. The heater 111 is comprised of for example an electric heating wire or other wire-shaped heater, flat heater, or block shaped heater etc. Further, it may be a heat exchanger through which a heat medium circulates etc. This heater 111 may be configured to heat the IC chip through the lead press 104.

This heater 111 is controlled by a control device 130. The control device 130 may also be part of a control device for controlling the electronic device test apparatus as a whole.

In the present embodiment, the holding head 102 is provided with a cooling tube 115. It is possible to discharge cooling air from a front end opening of the cooling tube, that is, a cooling nozzle 117, toward the IC tube 110. The cooling tube 115 has a control valve 118 and cooling air supply source 120 connected to it.

The control valve 118 is controlled by the control device 130 and can control the amount of the cooling air discharged from the cooling nozzle 117. The cooling air supply source 120 is comprised of a blower or other blowing device alone when the temperature of the cooling air is room temperature. When also controlling the temperature of the cooling air, a cooling device is also used in addition to the blowing device. The cooling air supply source 120 is controlled by the control device 130 and controlled in the amount of the cooling air and/or temperature of the cooling air.

Next, the mode of operation of the electronic device test holding device 100 according to the present embodiment will be explained.

The holding device 100 shown in FIG. 1 picks up an IC chip 110 heated to a set temperature from a not shown IC chip preheater. The holding device 100 holding the IC chip 110 is moved in the horizontal direction by a not shown XY movement device and conveys the IC chip 110 so that, as shown in FIG. 2, the IC chip 110 held by suction by the suction holding nozzle 106 comes above the test socket 114 having the test connection terminals 112 arranged above the test board 116.

During conveyance of the IC chip 110, the heater 111 heats the IC chip 110 to a temperature higher than the set temperature of the test and simultaneously discharges cooling air from the cooling nozzle 117 to cool the IC chip 110 until reaching near the set temperature of the test. The amount of heating by the heater 111 and the amount of cooling by the cooling air discharged from the discharge nozzle 117 are controlled by the control device 130. The amount of cooling by the cooling air discharged from the discharge nozzle 117 is set so as to become the same as the amount of heat escaping due to conductance by contact of the IC chip 110 with the connection terminals 112.

Figure 2:
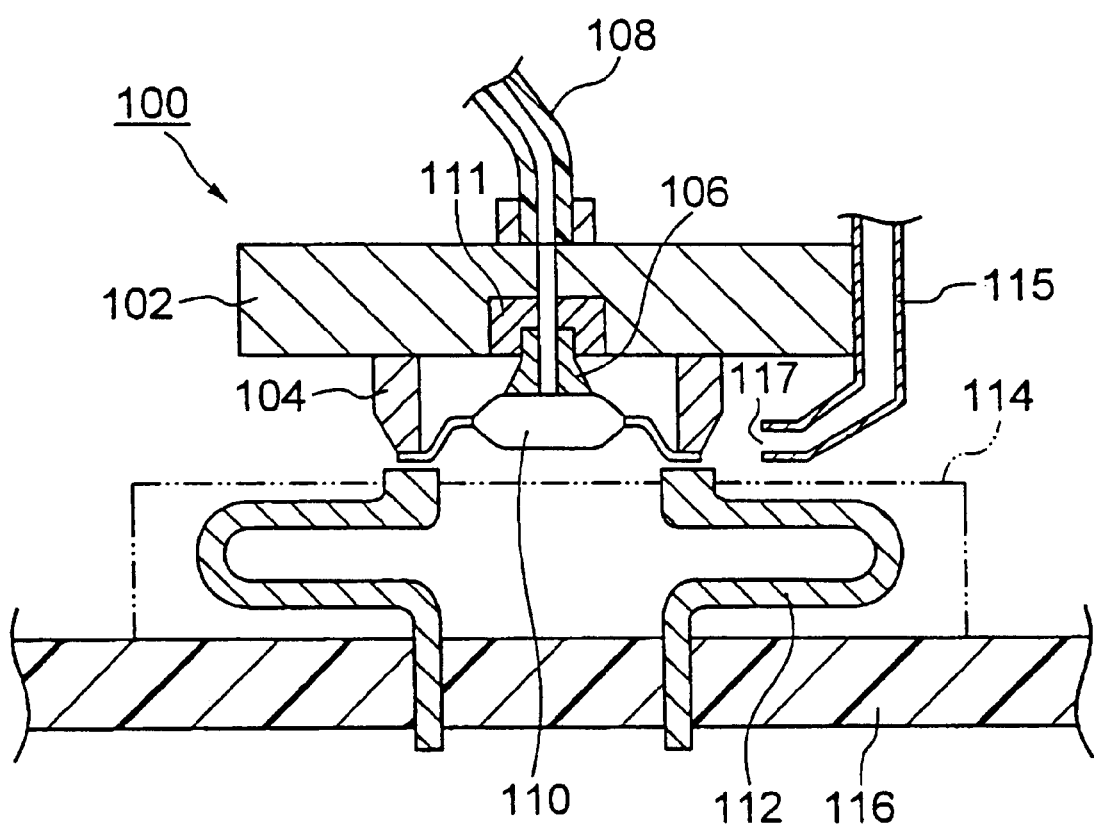
FIG. 2 is a schematic view of a test state according to the electronic device test holding device shown in FIG. 1.

Next, as shown in FIG. 2, the holding head 102 is made to move downward in the Z-axial direction to bring the terminals of the IC chip 110 into contact with the connection terminals 112 of the socket 114 and press the terminals of the IC chip by the lead press 104 against the connection terminals of the socket 114 by a predetermined pressure. At the same time, the control device 130 sends control signals to the control valve 118 and cooling air supply source 120 to stop the discharge of cooling air from the cooling nozzle 117.

The IC chip 110 continues to be heated by the heater 111 however. When the IC chip 110 is pressed against the connection terminals 112, the heat of the IC chip 110 is robbed from there by conduction and the temperature of the IC chip 110 falls. However, almost simultaneously with pressing the IC chip 110 against the connection terminals 112, the cooling from the cooling nozzle 117 is stopped, so the escape of heat due to conduction to the connection terminals 112 is canceled out by the suspension of cooling of the IC chip 110 by the cooling nozzle 117 and therefore the temperature of the IC chip 110 is maintained at the set temperature at the time of the test. In this state, a test use signal current is sent from the test board 116 through the connection terminals 112 to the IC chip 110 to test the IC chip 110.

Therefore, in the present embodiment, it becomes possible to maintain the temperature of the IC chip 110 during the test at a predetermined set temperature without attaching a heater to the test socket 114 side where the connection terminals 112 are provided and an accurate, high reliability test becomes possible.

Second Embodiment

Figure 3:
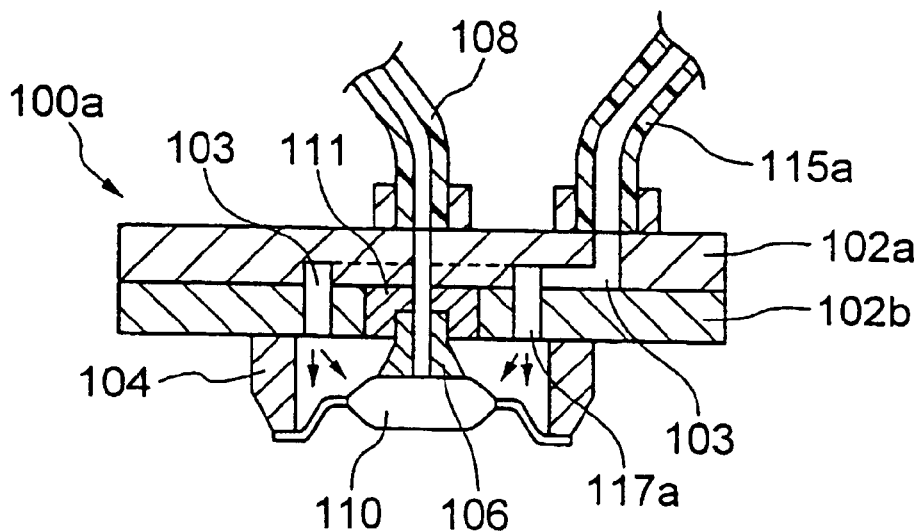
FIG. 3 is a schematic sectional view of an electronic device test holding device according to another embodiment of the present invention.
Figure 3:
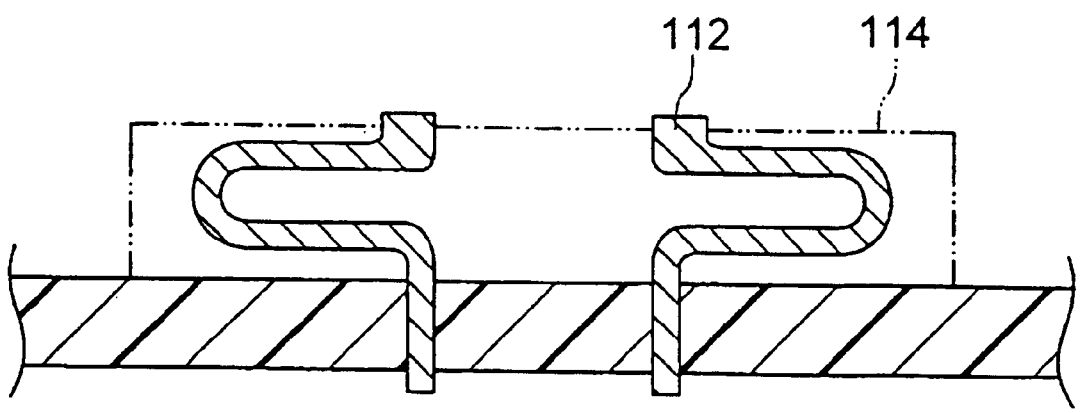

As shown in FIG. 3, in the electronic device test holding device 110a of the present embodiment, the holding head is comprised of a top head 102a and a bottom head 102b. A cooling passage 103 is formed between these and a cooling tube 115a is connected to the top opening of the cooling passage 103. The bottom opening of the cooling passage 103 forms a ring-shaped cooling nozzle 117a. Cooling air can be discharged from there to the IC chip 110. The rest of the configuration of the electronic device test holding device 100a of the present embodiment is similar to the holding device 100 shown in FIG. 1 and FIG. 2, so the explanation will be omitted. The holding device 100a of the present embodiment exhibits a similar action to that of the holding device 100 shown in FIG. 1 and FIG. 2 and the cooling nozzle 117a is provided closer to the IC chip 110, so the cooling efficiency of the IC chip 110 is further improved and the hardware configuration becomes simpler.

Third Embodiment

Figure 4:
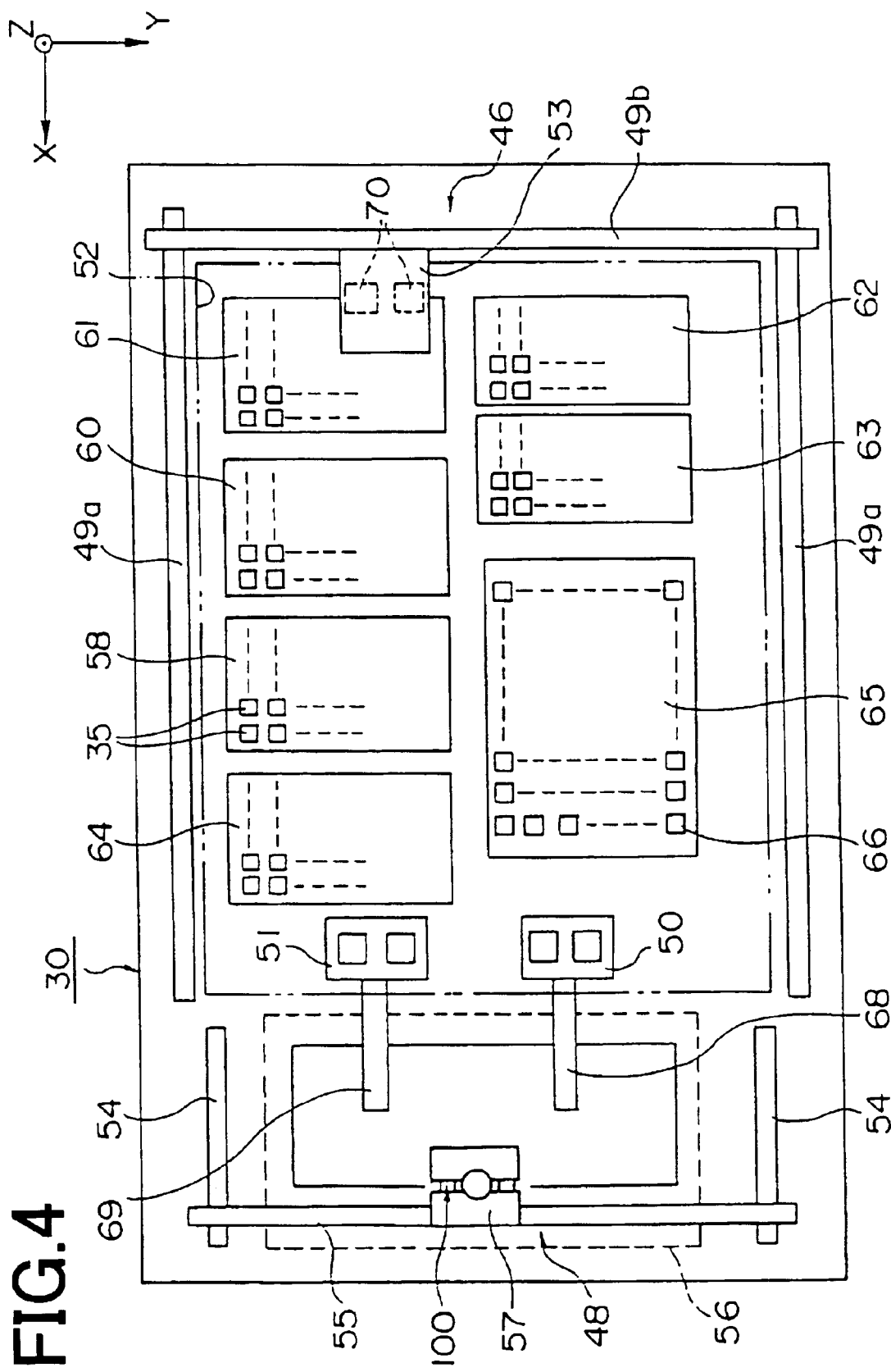
FIG. 4 is a schematic plan view of an electronic device test apparatus according to an embodiment of the present invention.

As shown in FIG. 4 and FIG. 5, in the present embodiment, the electronic device test holding device 100 in the first embodiment is attached to a second movable head 57 of the electronic device test apparatus 30.

As shown in FIG. 4 and FIG. 5, the electronic device test apparatus 30 of the present embodiment is an apparatus for conducting a heat test in a state where the temperature of the IC chip of the device under test is higher than ordinary temperature and has a handler 32, test head 34, and test main unit 36.

The handler 32 conveys IC chips 110 under test successively to the test socket 114 provided at the test head 34, separates the IC chips 110 finished being tested in accordance with the test results, and stores them in predetermined trays.

The test socket 114 provided at the test head 34 is connected to the test main unit 36 through a cable 38, connects an IC chip 110 detachably attached to the test socket 114 to the test main unit 36 through the cable 38, and tests the IC chip 110 by a test signal from the test main unit 36.

Note that the test socket 114 provided at the test head 34 is not attached directly on the test head 34, but is attached through several members. That is, a mother board is attached to the top surface of the test head 34, while the mother board has an exchange adapter detachably attached to it. The exchange adapter has board spacers, a socket board, etc. attached to it, while these in turn have a socket 114 attached to them.

When the type of the IC chips 110 under test changes, the exchangeable adapter is detached from the mother board and another adapter is attached so as to enable testing of a different IC chip 110 to be handled. Note that when the content of the test is greatly changed, the test head 34 shown in FIG. 5 is detached from the handler 32 and a separate test head 34 is placed in the space 42 of the handler 32 to deal with it.

The handler 32 has a board 40. It is mainly above this board 40 that the drive parts for conveying the IC chips are mounted. Below the board 40 is housed the control device for controlling the handler 32. A space 42 is partially provided, however. This space 42 has the test head 34 exchangeably arranged in it. An IC chip 110 can be attached to the test socket 114 through a hole 44 formed in the board 40.

The board 40, as shown in FIG. 4, is provided on it with two first and second X-Y movement devices 46 and 48. The first X-Y movement device 46 performs the work of conveying an IC chip 110 to be tested from then on and the work of classifying the IC chips 110 finished being tested. The second X-Y movement device 48 performs the work of conveying an IC chip 110 supplied from a buffer 50 above the test head 34 and transporting a tested IC chip 110 from the test head 34 to another buffer 51.

The first X-Y movement device 46 has a first X-axial rail 49a extending along the X-axial direction, a first Y-axial rail 49b extending along the Y-axial direction and configured to be able to be moved in the X-direction along the first X-axial rail 49a, and a first movable head 53 able to move in the Y-direction along the first Y-axial rail 49b. The first X-Y movement device 46 has a first area 52 on the board 40 as a conveyable area.

The other second X-Y movement device 48 has a second X-axial rail 54 extending along the X-axial direction, a second Y-axial rail 55 extending along the Y-axial direction and configured to be able to be moved in the X-direction along the second X-axial rail 54, and a second movable head 57 able to move in the Y-direction along the second Y-axial rail 55. The X-Y movement device 48 has a second area 56 on the board 40 as a conveyable area.

The first conveyable area 52 has a feed tray 58 for storing IC chips 110 to be tested from then on, classifying trays 60, 61, 62, and 63 for storing tested IC chips 110 separated according to the test results, and a part 64 where empty trays are stacked arranged on it and further has a heat plate 65 arranged in proximity to the buffer 50.

The heat plate 65 is for example formed by a metal material, is provided with a plurality of IC storage depressions 66 for storing IC chips 110 to be tested, and has IC chips 110 to be tested conveyed to the IC storage depressions 66 from the feed tray 58 by the X-Y movement device 46. The heat plate 65 is for heating the IC chips 110 before testing to a predetermined temperature, so is heated by a not shown heater. The IC chips 110 under test are heated to a desired temperature on the heat plate 65, then moved to the buffer 50 using the movement device 46 and conveyed to the test head 34 by the second X-Y movement device 48 where they are then tested. That is, the IC chip 110 is tested in a state higher than ordinary temperature.

The buffers 50 and 51 are configured to be able to move in the X-direction along the rails 68 and 69 and are configured to move back and forth between the operating area 52 of the first X-Y movement device 46 and operating region 56 of the second X-Y movement device 48. That is, the buffer 50 performs the work of moving the IC chips 110 under test from the area 52 to the area 56, while the buffer 51 performs the work of carrying the tested IC chips 110 from the area 56 to the area 52. The presence of the buffers 50 and 51 enables the X-Y movement devices 46 and 48 to be operated without interference.

The first X-Y movement device 46 has an X-axis drive means 70 attached to it. This Z-axis drive means 70 performs the operation of picking up IC chips 110 from the trays and the operation of lowering IC chips 110 to the trays.

The second X-Y movement device 48, as explained above, has an electronic device test holding device 100 according to the first embodiment attached to it. This electronic device test holding device 100 performs the operation of picking up IC chips 110 from the buffer stage 50 or test socket 114 provided at the test head 34, the operation of conveying the IC chips 110, the operation of lowering the IC chips 110 to the buffer stage 51, and the operation of pressing the IC chips 110 to the test socket 114 provided at the test head 34. The operation for conveying the IC chips 110 and the operation for pressing the IC chips 110 into the test socket 114 have been sufficiently explained in the first embodiment, so the explanation will be omitted here.

The Z-axis drive means 70 attached to the first X-Y movement device 46 for example operates two air cylinders in tandem to be able to hold by suction and convey two IC chips 110 at one time. The second X-Y movement device 48 also has a similar Z-axis drive means attached to it.

In the electronic device test apparatus 30 according to the present embodiment, the electronic device test holding device 100 in the first embodiment is attached to the second movable head 57 of the electronic device test apparatus 30, so the action explained in the first embodiment is exhibited when testing an IC chip.

Note that the present invention is not limited to the above embodiments and can be modified in various ways within the scope of the present invention.

For example, the electronic device test apparatus to which the electronic device test holding device of the present invention is attached is not limited to the apparatus 30 shown in FIG. 4 and FIG. 5. The device may also be applied to another device test apparatus or a device handling apparatus other than a test apparatus.

As explained above, according to the present invention, it is possible to provide an electronic device test holding device, electronic device test apparatus, and electronic device test method able to maintain an electronic device to be tested at a predetermined high temperature state and perform a high temperature test well without causing an increase in the manufacturing cost and running cost of the test apparatus.

What is claimed is:

1. An electronic device test holding device comprising:
a holding head for detachably holding and conveying an electronic device for connecting the electronic device with connection terminals for testing,
a heating means attached to said holding head and able to heat said electronic device in accordance with need,
a cooling means attached to said holding head and able to cool said electronic device in accordance with need, and
a controlling means for controlling said heating means and said cooling means so as to heat said electronic device by said heating means and to cool said electronic device by said cooling means while conveying said electronic device by said holding head and so as to heat said electronic device by said heating means and to stop or weaken the cooling by said cooling means when pressing said electronic device to said connection terminals by said holding head.

2. The electronic device test holding device as set forth in claim 1, characterized in that said controlling means controls said cooling means so as to rob from said electronic device during the conveyance of said electronic device an amount of heat corresponding to the amount of heat which escapes from said electronic device to said connection terminals when said electronic device contacts said connection terminals.

3. The electronic device test holding device as set forth in claim 1 or 2, wherein said cooling means is a cooling air discharge nozzle.

4. The electronic device test holding device as set forth in claim 3, wherein said cooling air discharge nozzle is formed integrally with a discharge opening of a cooling air passage formed inside said holding head.

5. The electronic device test holding device as set forth in claim 1 or 2, wherein said cooling means is an electronic cooling means using a Peltier device.

6. The electronic device test holding device as set forth in claim 1, wherein said holding head is provided with a suction holding nozzle for detachably holding the electronic device by suction.

7. The electronic device test holding device as set forth in claim 6, wherein said cooling means is a cooling air discharge nozzle and said cooling air discharge nozzle is formed around said suction holding nozzle.

8. An electronic device test apparatus comprising:

connection terminals for testing, a holding head for detachably holding and conveying an electronic device for connecting the electronic device with said connection terminals, a heating means attached to said holding head and able to heat said electronic device in accordance with need, a cooling means attached to said holding head and able to cool said electronic device in accordance with need, a movement mechanism for making said holding head move in a horizontal direction and/or a vertical direction, and a controlling means for controlling said heating means and said cooling means so as to heat said electronic device by said heating means and to cool said electronic device by said cooling means while conveying said electronic device with said holding head drived by said movement mechanism and so as to heat said electronic device by said heating means and to stop or weaken the cooling by said cooling means when pressing said electronic device to said connection terminals by said holding head.

9. The electronic device testing apparatus as set forth in claim 8, characterized in that said controlling means controls said cooling means so as to rob from said electronic device during the conveyance of said electronic device an amount of heat corresponding to the amount of heat which escapes from said electronic device to said connection terminals when said electronic device contacts said connection terminals.

10. The electronic device testing apparatus as set forth in claim 8 or 9, wherein said cooling means is a cooling air discharge nozzle.

11. The electronic device testing apparatus as set forth in claim 10, wherein said cooling air discharge nozzle is formed integrally with a discharge opening of a cooling air passage formed inside said holding head.

12. The electronic device testing apparatus as set forth in claim 8 or 9, wherein said cooling means is an electronic cooling means using a Peltier device.

13. The electronic device testing apparatus as set forth in claim 8, wherein said holding head is provided with a suction holding nozzle for detachably holding an electronic device by suction.

14. The electronic device testing apparatus as set forth in claim 13, wherein said cooling means is a cooling air discharge nozzle and said cooling air discharge nozzle is formed around said suction holding nozzle.

* * * * *